United States Patent
Oh et al.

(10) Patent No.: US 8,531,349 B2
(45) Date of Patent: Sep. 10, 2013

(54) DUAL DISPLAY MODULE AND DISPLAY APPARATUS HAVING THE SAME

(75) Inventors: Yoon-Chan Oh, Suwon-si (KR); Chan-Kyoung Moon, Suwon-si (KR); Kyoung-Soo Lee, Suwon-si (KR); Min-Hyeng Lee, Suwon-si (KR); Seon-Hee Kim, Suwon-si (KR); Gun-Mo Kim, Suwon-si (KR); Choong-Ho Lee, Suwon-si (KR); Byung-Hee Kim, Suwon-si (KR); Kuen-Dong Ha, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 942 days.

(21) Appl. No.: 12/382,556

(22) Filed: Mar. 18, 2009

(65) Prior Publication Data
US 2009/0237324 A1    Sep. 24, 2009

(30) Foreign Application Priority Data

Mar. 18, 2008    (KR) .................. 10-2008-0024905

(51) Int. Cl.
*G09G 5/00*    (2006.01)

(52) U.S. Cl.
USPC ............. 345/1.1; 345/4; 345/40; 345/76; 345/82; 345/83

(58) Field of Classification Search
USPC .......... 345/1.1, 4, 39, 40, 46, 82, 83, 76–80, 345/204; 313/504
See application file for complete search history.

(56) References Cited

U.S. PATENT DOCUMENTS

| | | | |
|---|---|---|---|
| 7,453,426 B2 * | 11/2008 | Yamazaki ................... | 345/76 |
| 7,522,230 B2 * | 4/2009 | Lee ............................. | 349/58 |
| 8,045,087 B2 * | 10/2011 | Hwang et al. ............... | 349/58 |
| 2006/0072052 A1 * | 4/2006 | Kim et al. .................... | 349/60 |
| 2007/0079537 A1 * | 4/2007 | Lee ............................. | 40/750 |
| 2007/0131944 A1 * | 6/2007 | Hu et al. ...................... | 257/81 |

FOREIGN PATENT DOCUMENTS

| | | |
|---|---|---|
| JP | 2006-039554 A | 2/2006 |
| JP | 2007-133281 A | 5/2007 |
| KR | 10020060057962 A | 5/2006 |
| KR | 10-2007-0108120 A | 11/2007 |

OTHER PUBLICATIONS

Korean Office action issued on Feb. 22, 2010, corresponding to the Korean Priority Application No. 10-2008-0024905.
Transmitter letter and the Korean Office Action issued by Korean patent office on Aug. 18, 2009 in the corresponding Korean Patent Application No. 10-2008-0024905.

* cited by examiner

*Primary Examiner* — Kevin M Nguyen
*Assistant Examiner* — Jennifer Nguyen
(74) *Attorney, Agent, or Firm* — Robert E. Bushnell, Esq.

(57) ABSTRACT

A dual display module having a first display panel and a second display panel, the dual display module including a bezel arranged between the first display panel and the second display panel, and having a penetration area between the first display panel and the second display panel; and a supporting member arranged between the bezel and the second display panel and supporting the second display panel, the supporting member having at least one protrusion unit that protrudes through the penetration area to face the first display panel.

20 Claims, 5 Drawing Sheets

DUAL DISPLAY MODULE AND DISPLAY APPARATUS HAVING THE SAME

CLAIM OF PRIORITY

This application makes reference to, incorporates the same herein, and claims all benefits accruing under 35 U.S.C. §119 from an application for DUAL DISPLAY MODULE AND DISPLAY APPARATUS HAVING THE SAME earlier filed in the Korean Intellectual Property Office on 18 Mar. 2008 and there duly assigned Serial No. 10-2008-0024905.

BACKGROUND OF THE INVENTION

1. Field of the Invention

A dual display module which is slim and has enhanced impact resistance and a display apparatus having the dual display module.

2. Description of the Related Art

Recently, display apparatuses capable of replacing the cathode-ray tube (CRT) displays have been developed. Examples of such display apparatuses are the liquid crystal display (LCD), the field emission display (FED), the plasma display panel (PDP), the electro-luminescence (EL) display device, and the like. From among the above, the PDP is highlighted since the PDP has a simple structure and a simple manufacturing process, and is the most appropriate display apparatus that has a large screen. However, the PDP is disadvantageous because of its low luminous efficiency, low luminance, and high power consumption. In contrast, an active matrix LCD (AMLCD), having thin film transistors (TFTs), is manufactured by a semiconductor device technique, and thus the AMLCD is disadvantageous for a large screen. However, since notebook computers commonly adopt the AMLCD as a display device, there is an increasing demand for the AMLCD. But AMLCD is also disadvantageous in that it is difficult to design and make a large screen AMLCD, and the AMLCD requires a high power consumption due to a backlight unit. Also, the AMLCD has many optical losses due to the presence of optical devices such as a polarized light filter, a prism sheet, a diffusion plate, and the like, and the AMLCD also has a narrow viewing angle.

In contrast, the EL display device is largely divided into an inorganic EL device and an organic EL device, according to materials used for the emission layer. The EL display device is a self light-emitting device and is advantageous for its fast response time, high luminous efficiency, high luminance, and wide view-angle. From among such EL display devices, the organic light emitting diode (OLED), that is the EL display device using organic materials, is advantageous due to its low direct-current (DC) driving voltage, its thinning probability, its uniformity of emitted light, its easy pattern forming, its high luminous efficiency, its full color emission in a visible ray region, and the like. As a result, the OLED is a technology field that is actively being developed.

Such an OLED is divided into a bottom-emission type and a top-emission type, according to the light emitting direction. Also, the OLED is divided into a passive matrix OLED (PMOLED) and an active matrix OLED (AMOLED), according to the driving method.

Recently, a dual display panel is used. The dual display panel has two OLED panels. An AMOLED may be disposed on one surface of the dual display panel and a PMOLED may be disposed on the other surface of the dual display panel. The dual display panel is used in mobile phones. In particular, with respect to the dual display panel used in a folder-type mobile phone, when a user folds the folder-type mobile phone, an OLED panel (e.g., the PMOLED) disposed on one surface of the dual display panel may be used, and when a user unfolds the folder-type mobile phone, an OLED panel (e.g., AMOLED) disposed on the other surface of the dual display panel may be used.

SUMMARY OF THE INVENTION

The present invention provides a dual display module, which is slim and has enhanced impact resistance, and a display apparatus having the dual display module.

According to an aspect of the present invention, there is provided a dual display module having a first display panel arranged in parallel to a second display panel, a bezel arranged between the first display panel and the second display panel, the bezel having a penetration area between the first display panel and the second display panel and a supporting member arranged between the bezel and the second display panel, the bezel being adapted to support the second display panel, wherein the supporting member includes at least one protrusion unit that protrudes through the penetration area of the bezel, the at least one protrusion unit facing the first display panel.

The dual display module can also include an impact absorbing member arranged between the first display panel and the protrusion unit, the impact absorbing member can be adapted to reduce contact stress between the first display panel and the at least one protrusion unit. One surface of the impact absorbing member can be bonded to the first display panel and an opposite surface of the impact absorbing member can be bonded to the at least one protrusion unit. An area of the impact absorbing member can be smaller or equal to an area of the penetration area. Each of the at least one protrusion unit can be arranged in parallel to each other. The at least one protrusion unit can be arranged to be parallel to both side portions of the second display panel. The at least one protrusion unit and the supporting member can be of a single integrated monolithic unit. The at least one protrusion unit can be distinguished from the supporting member and can be assembled to one surface of the supporting member. Each of the first display panel and the second display panel can an OLED (organic light emitting diode) display panel. The first display panel can be an active matrix OLED display panel. The second display panel can be a passive matrix OLED display panel.

According to another aspect of the present invention, there is provided a display apparatus that includes the previously described dual display module.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
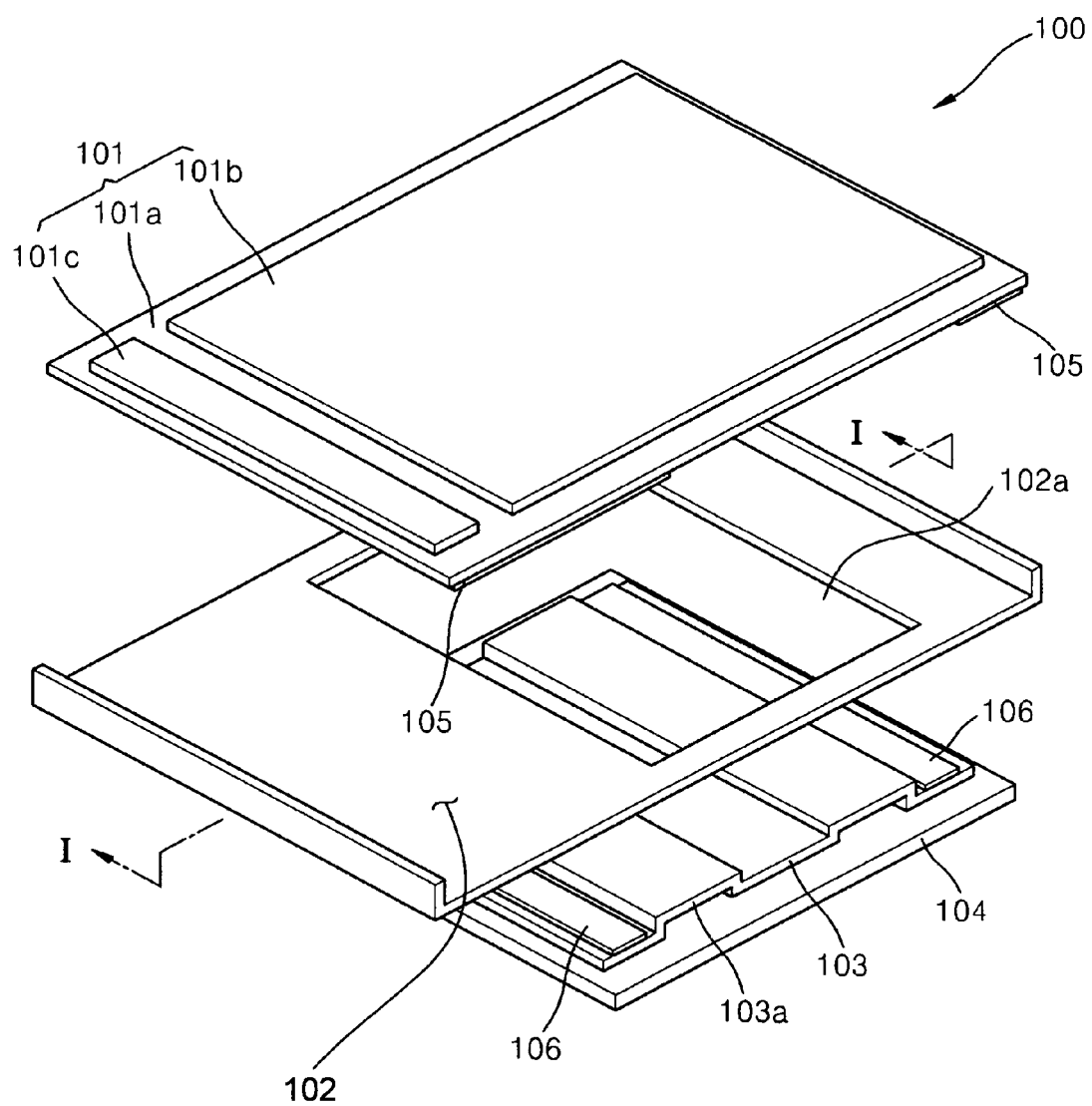
FIG. 1 is an exploded perspective view of a dual display module according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the thicknesses of layers and regions are exaggerated for clarity. Like reference numerals in the drawings denote like elements, and thus their description will be omitted thereof.

In the present invention, an organic light emitting diode (OLED) display apparatus, which realizes an image by using a self light-emission of an OLED, is described as a display apparatus. However, the present invention is not limited thereto but also includes a case in which the display apparatus is supported by a bezel.

Figure 2:
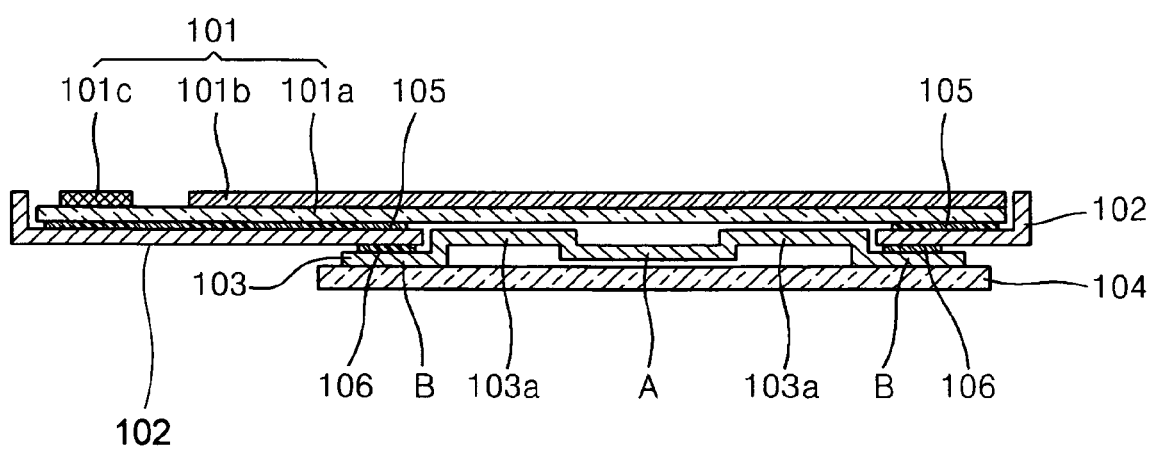
FIG. 2 is a cross-sectional view of the dual display module of FIG. 1, taken along line I-I.

Turning now to FIGS. 1 and 2, FIG. 1 is an exploded perspective view of a dual display module 100 according to an embodiment of the present invention and FIG. 2 is a cross-sectional view of the dual display module 100 of FIG. 1 taken along line I-I. Referring to FIGS. 1 and 2, the dual display module 100 according to the current embodiment of the present invention includes a first display panel 101, a bezel 102, a supporting member 103, a second display panel 104, a first adhesive member 105, and a second adhesive member 106.

The first display panel 101 can be an OLED display panel. In the case where the first display panel 101 is the OLED display panel, the first display panel 101 can include a substrate 101*a* upon which a plurality of OLEDs (not shown) are formed, a sealing substrate 101*b* sealing the plurality of OLEDs (not shown), and a driving integrated circuit (IC) 101*c*. The first display panel 101 can be arranged on the bezel 102 and can emit light in a direction away from bezel 102, thereby performing a display function. The first display panel 101 and the bezel 102 can be bonded together by using the first adhesive member 105. The first adhesive member 105 can be a double-sided adhesive tape.

The bezel 102 can be arranged between the first display panel 101 and the second display panel 104, and can support the first and second display panels 101 and 104. The bezel 102 can be made out of a metal such as aluminum having a high thermal conductivity and a high rigidity, so as to externally radiate heat transferred from the first and second display panels 101 and 104 while maintaining a supporting rigidity. Alternatively, bezel 102 can instead be made out of another material, such as plastic, which is non-conductive, light weight, and has a high rigidity.

The first display panel 101 can be arranged on one surface of the bezel 102, and the second display panel 104 can be arranged on the other surface of the bezel 102. More particularly, the supporting member 103 can be arranged between the bezel 102 and the second display panel 104 so as to support the second display panel 104. The bezel 102 can have a penetration area 102*a* (or an aperture) through which a part between the first display panel 101 and the second display panel 104 can penetrate. Since a protrusion unit 103*a* of the supporting member 103 is arranged within the penetration area 102*a*, a thickness of the dual display module 100 and a display apparatus having the same can be reduced.

The supporting member 103 can be arranged between the bezel 102 and the second display panel 104, and can support the second display panel 104. The bezel 102 can be arranged on one surface of the supporting member 103, and the second display panel 104 can be arranged on the other surface of the supporting member 103. The supporting member 103 and the bezel 102 can be bonded together by using the second adhesive member 106 that can be a double-sided adhesive tape. The supporting member 103 and the second display panel 104 can be bonded to each other by using an adhesive material that can be an adhesive, a pressure sensitive adhesive (PSA), and the like.

The supporting member 103 can be made out of a metal such as aluminum having a high thermal conductivity and a high rigidity, so as to externally radiate heat generated by the second display panel 104 while maintaining a supporting rigidity. Alternatively, the supporting member 103 can be made out of other materials, including plastic, which has a no conductivity, a light weight, and a high rigidity.

The supporting member 103 can have at least one protrusion unit 103*a*. The protrusion unit 103*a* can be formed on the supporting member 103 so as to face the first display panel 101 through the penetration area 102*a*. The protrusion unit 103*a* and the supporting member 103 can be of a single body. A press-manufacturing method or the like can be used to make the protrusion unit 103*a* and the supporting member 103 as a single body, however the present invention is not limited thereto. Thus, the protrusion unit 103*a* can instead be made separately from the supporting member 103 and can then be assembled to the supporting member 103. The protrusion unit 103*a*, separately made from the supporting member 103, can be assembled to the supporting member 103 by welding or the like, and can also be connected to the supporting member 103 by using a connection means such as a screw or a pin.

Alternatively, the protrusion unit 103*a* can be arranged within the penetration area 102*a*. More specifically, the protrusion unit 103*a* can be made as a center portion of the supporting member 103 so as to correspondingly be inserted in the penetration area 102*a*. In this manner, the protrusion unit 103*a* is located within the penetration area 102*a*, so that the thickness of the dual display module 100 and the display apparatus having the same can be reduced.

In the case where a plurality protrusion units 103*a* are formed, each of the protrusion units 103*a* can be arranged to be parallel to each other. Also, as illustrated in FIGS. 1 and 2, the plurality protrusion units 103*a* can be formed to be parallel with both side portions of the second display panel 104.

The protrusion unit 103*a* can be made as a center portion A of the supporting member 103. The center portion A of the supporting member 103 can be separated from the second display panel 104, such that the center portion A and the second display panel 104 do not contact each other. The second display panel 104 can be bonded to both side portions B of the supporting member 103. That is, the second display panel 104 is separated from the center portion A of the supporting member 103 having the protrusion unit 103*a* thereon, and is bonded to both side portions B of the supporting member 103. By doing so, the protrusion unit 103*a* can absorb an external impact and transfer the external impact to both side portions B of the supporting member 103, thereby reducing the transfer of the external impact to the second display panel 104.

The second display panel 104 can be an OLED display panel. In particular, the second display panel 104 can be a passive matrix OLED (PMOLED) display panel. The second display panel 104 can be arranged on the supporting member 103 so as to be supported.

The first adhesive member 105 can be arranged between the first display panel 101 and the bezel 102, and can attach the first display panel 101 to the bezel 102. That is, one surface of the first adhesive member 105 can be bonded to the first display panel 101 and the other surface of the first adhesive member 105 can be bonded to the bezel 102. The first adhesive member 105 can be a double-sided adhesive tape.

The second adhesive member 106 can be arranged between the supporting member 103 and the bezel 102, and can attach the supporting member 103 to the bezel 102. More particularly, the second adhesive member 106 can be arranged between both side portions B of the supporting member 103 and a part of the bezel 102 that is close to the penetration area 102a. One surface of the second adhesive member 106 can be bonded to the bezel 102, and the other surface of the second adhesive member 106 can be bonded to both side portions B of the supporting member 103. The second adhesive member 106 can be a double-sided adhesive tape.

Figure 3:
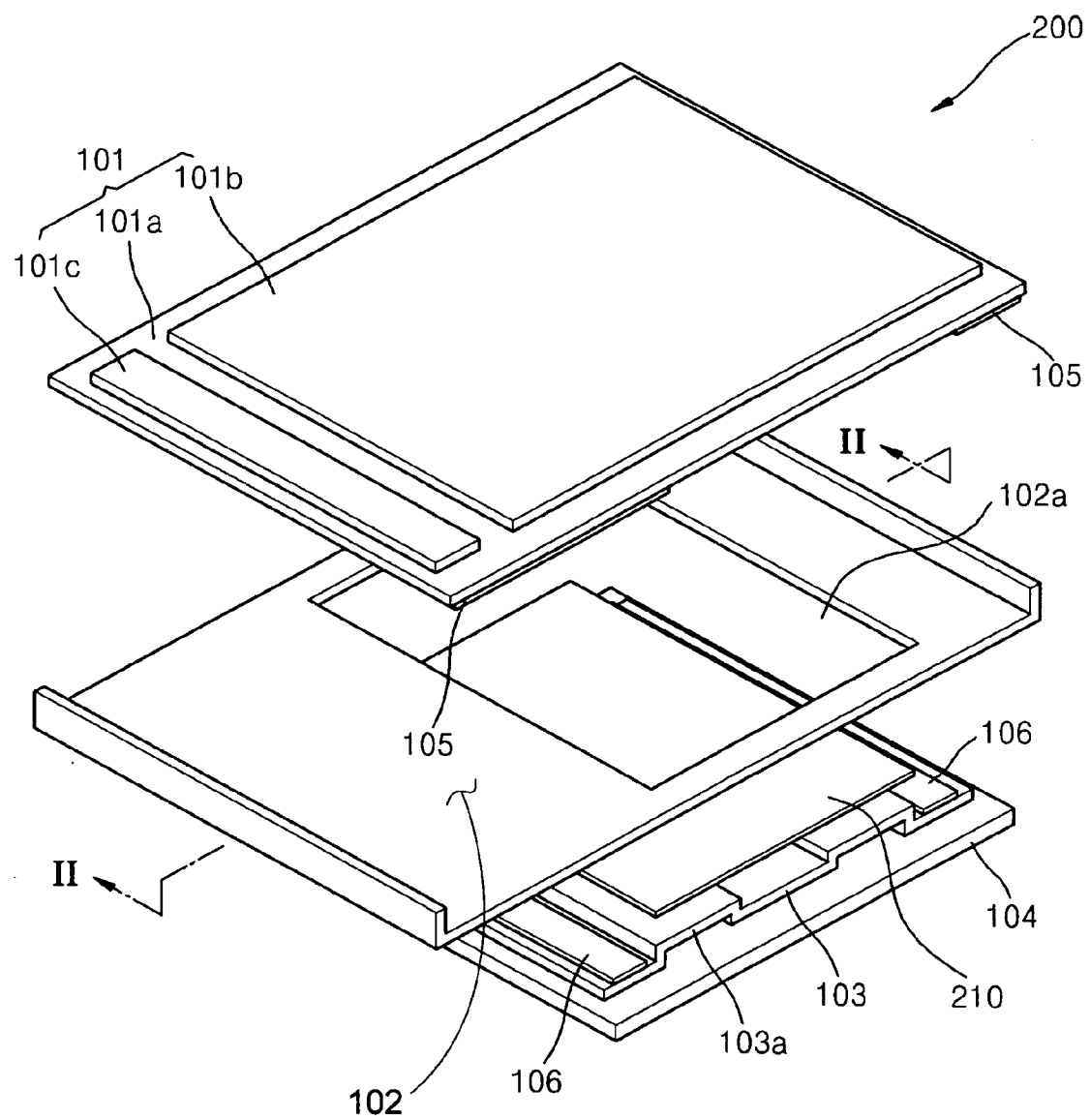
FIG. 3 is an exploded perspective view of a dual display module according to another embodiment of the present invention.
Figure 4:
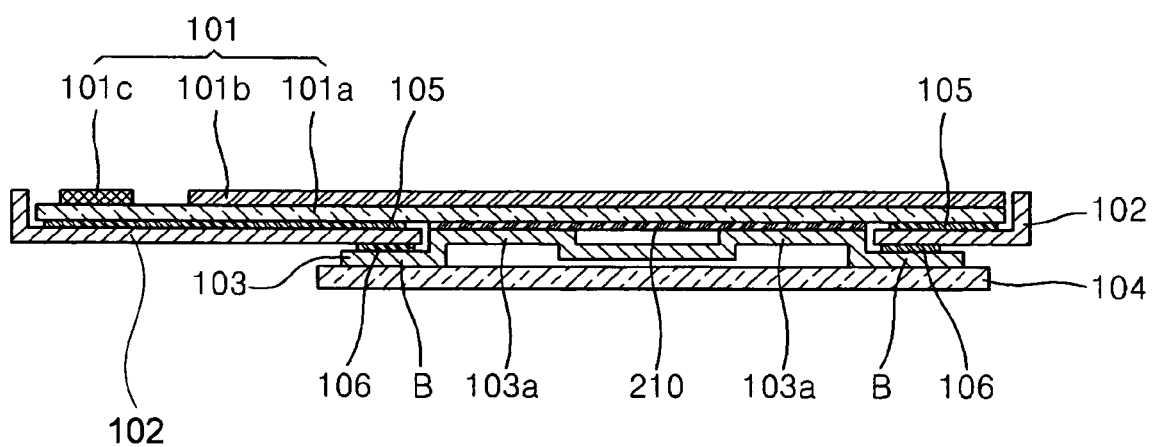
FIG. 4 is a cross-sectional view of the dual display module of FIG. 3, taken along line II-II.

Turning now to FIGS. 3 and 4, FIG. 3 is an exploded perspective view of a dual display module 200 according to another embodiment of the present invention and FIG. 4 is a cross-sectional view of the dual display module 200 of FIG. 3, taken along line II-II. The dual display module 200 of FIGS. 3 and 4 is different from the dual display module 100 of FIGS. 1 and 2 in that the dual display module 200 further includes an impact absorbing member 210. Like reference numerals in the drawings denote like elements, and thus descriptions about components of FIGS. 3 and 4 having the same reference numerals as those of components of FIGS. 1 and 2 will be omitted.

The impact absorbing member 210 can be arranged between the first display panel 101 and the protrusion unit 103a. The impact absorbing member 210 can be made out of a material capable of absorbing an impact. By having the impact absorbing member 210 between the first display panel 101 and the protrusion unit 103a, a contact stress that occurs between the first display panel 101 and the protrusion unit 103a can be reduced. The dual display module 100 illustrated in FIGS. 1 and 2 includes the penetration area 102a in the bezel 102 for reducing the thickness. The protrusion unit 103a of the supporting member 103 is protruded through the penetration area 102a so as to face the first display panel 101, but does not directly contact the first display panel 101. However, in the case where an external force is applied, for example, when the dual display module 100 is dropped, the first display panel 101 and the protrusion unit 103a can collide against each other due to a drop impact, thereby resulting in contact stress that can damage the first and second display panels 101 and 104. In particular, in the case where the first and second display panels 101 and 104 are OLED display panels, the contact stress can damage an organic film and can cause a display defect.

In contrast, the dual display module 200 illustrated in FIGS. 3 and 4 includes the impact absorbing member 210 between the first display panel 101 and a supporting member 103, so as to prevent direct contact between the protrusion unit 103a of the supporting member 103 and the first display panel 101, thereby reducing the contact stress between the first and second display panels 101 and 104 and the supporting member 103 due to external force. By doing so, a display defect can be prevented.

Figure 5:
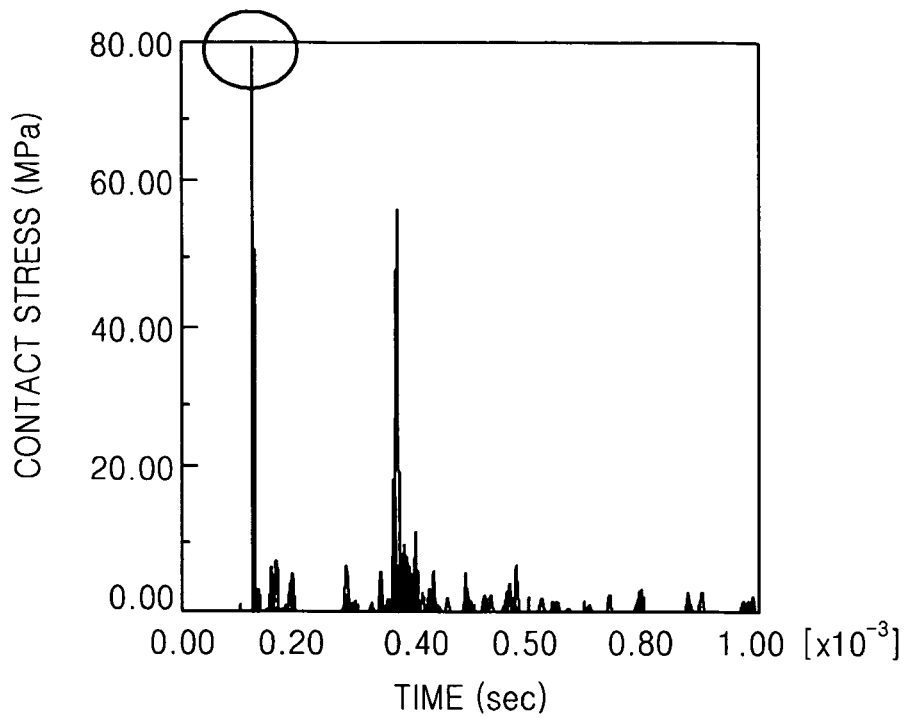
FIG. 5 is a graph illustrating the contact stress of the dual display module of FIG. 1.
Figure 6:
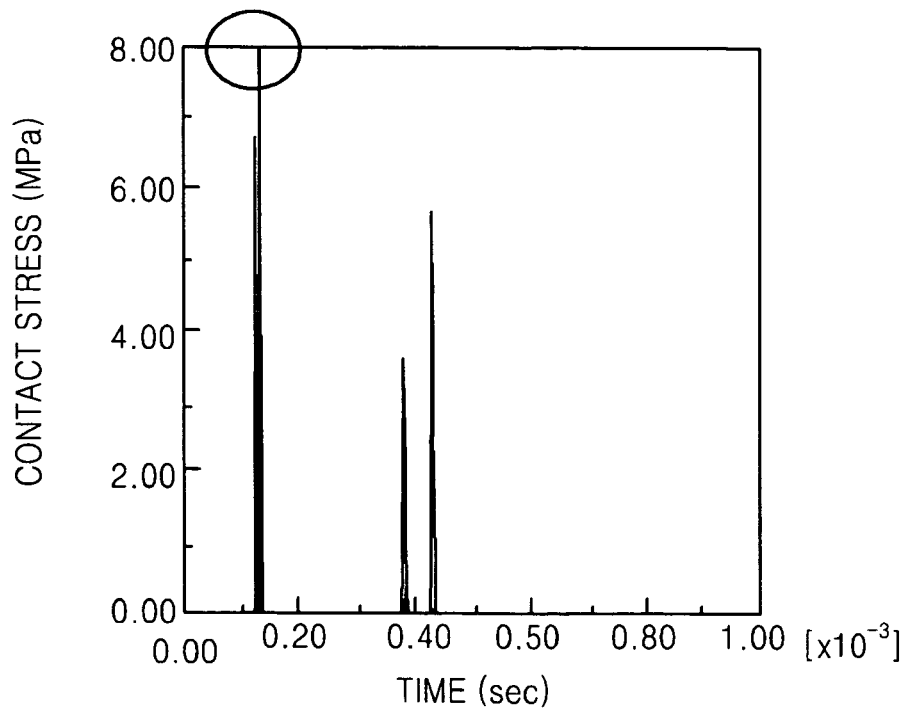
FIG. 6 is a graph for illustrating the contact stress of the dual display module of FIG. 3.

Turning now to FIGS. 5 and 6, FIGS. 5 and 6 are graphs for illustrating results of drop impact simulations of the dual display modules 100 and 200 respectively. More specifically, FIG. 5 is a graph illustrating a contact stress that occurred between bezel 102 and second display panel 104 when the dual display module 100 of FIGS. 1 and 2 is dropped and FIG. 6 is a graph illustrating a contact stress that occurred between bezel 102 and second display panel 104 when the dual display module 200 of FIGS. 3 and 4 is dropped. The drop impact simulations are performed under a condition that the dual display modules 100 and 200, having an active matrix OLED (AMOLED) display panel as the first display panel 101 and a PMOLED display panel as the second display panel 104 each, are dropped from a height of 1.5 meters (M).

As can be gleaned from FIGS. 5 and 6, the maximum contact stress of the dual display module 100 is approximately 80 Mega Pascal (MPa), and the maximum contact stress of the dual display module 200 is approximately 8 MPa. This means that the contact stress of the dual display module 200 having the impact absorbing member 210 is reduced to 10% of that of the dual display module 100 that does not have the impact absorbing member 210. Accordingly, the dual display module 200 according to the present invention can reduce damage to an organic film due to a drop impact, thereby decrease the possibility of a display defect such as a short circuit between subpixel.

According to the present invention, the dual display module and the display apparatus having the dual display module can both be made slim, and can be enhanced in terms of their impact resistance. While this invention has been particularly shown and described with reference to exemplary embodiments thereof, it will be understood by one of ordinary skill in the art that various changes in form and details can be made therein without departing from the spirit and scope of the invention as defined by the appended claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:
1. A dual display module, comprising:
a first display panel arranged in parallel to a second display panel;
a bezel arranged between the first display panel and the second display panel, the bezel having a penetration area between the first display panel and the second display panel; and
a supporting member arranged between the bezel and the second display panel, the supporting member being adapted to support the second display panel, wherein the supporting member includes at least one protrusion unit that protrudes through the penetration area of the bezel, the at least one protrusion unit facing the first display panel.

2. The dual display module of claim 1, further comprising an impact absorbing member arranged between the first display panel and the protrusion unit, the impact absorbing member being adapted to reduce contact stress between the first display panel and the at least one protrusion unit.

3. The dual display module of claim 2, wherein one surface of the impact absorbing member is bonded to the first display panel and an opposite surface of the impact absorbing member is bonded to the at least one protrusion unit.

4. The dual display module of claim 2, wherein an area of the impact absorbing member is smaller or equal to an area of the penetration area.

5. The dual display module of claim 1, wherein each of the at least one protrusion unit is arranged in parallel to each other.

6. The dual display module of claim 1, wherein the at least one protrusion unit is arranged to be parallel to two opposing edges of the second display panel.

7. The dual display module of claim 1, wherein the at least one protrusion unit and the supporting member are of a single integrated monolithic unit.

8. The dual display module of claim 1, wherein the at least one protrusion unit is distinguished from the supporting member and is assembled to one surface of the supporting member.

9. The dual display module of claim 1, wherein each of the at least one protrusion unit has a flat upper surface that faces, is parallel to and is spaced-apart from the first display panel.

10. The dual display module of claim 9, further comprising an impact absorbing member arranged between the first display panel and the upper flat surface of each of the at least one protrusion unit, the impact absorbing member being adapted to reduce contact stress between the first display panel and the at least one protrusion unit, the penetration area being an aperture in the bezel, the impact absorbing member being arranged within the aperture of the bezel.

11. The dual display module of claim 1, wherein the penetration area being an aperture in the bezel, wherein each of the at least one protrusion unit is arranged within and extends through the penetration area of the bezel.

12. A display apparatus comprising the dual display module of claim 1.

13. The dual display module of claim 1, the penetration area being an aperture in the bezel, the at least one protrusion extends from the supporting member towards the first display panel.

14. The dual display module of claim 1, the at least one protrusion being spaced-apart from the first display panel in a thickness direction of the display module that is in a direction normal to the major surfaces of the first display panel.

15. The dual display module of claim 1, the supporting member comprises:
 a first side portion bonded to the second display panel and arranged in a vicinity of and in parallel to a first edge of the second display panel;
 a first protrusion arranged adjacent to the first side portion and extending parallel to the first edge of the second display panel;
 a center portion arranged in parallel to the first protrusion;
 a second protrusion arranged in parallel to and adjacent to the center portion, the center portion being arranged between the first and second protrusions; and
 a second side portion arranged adjacent to and in parallel to the second protrusion and a second and opposite edge of the second display panel, the second side portion being bonded to the second display panel.

16. The dual display module of claim 15, the center portion facing the second display panel while being spaced-apart from the second display panel.

17. The dual display module of claim 15, each of the first and second protrusions having flat upper surfaces that face while being spaced apart from the first display panel, the center portion being a trough having a flat bottom surface facing the second display panel.

18. The dual display module of claim 15, the bezel being attached to the supporting member at said first and second side portions of the supporting member.

19. The dual display module of claim 15, further comprising an impact absorbing member arranged between the first display panel and top surfaces of each of the first and second protrusions.

20. The dual display module of claim 15, each of the first and second protrusions extending through the penetration area of the bezel.

* * * * *